United States Patent [19]
Boie et al.

[11] Patent Number: 5,337,353
[45] Date of Patent: Aug. 9, 1994

[54] CAPACITIVE PROXIMITY SENSORS

[75] Inventors: Robert A. Boie; Gabriel L. Miller, both of Westfield, N.J.

[73] Assignee: AT&T Bell Laboratories, Murray Hill, N.J.

[21] Appl. No.: 861,667

[22] Filed: Apr. 1, 1992

[51] Int. Cl.$^5$ .............................................. H04M 1/00
[52] U.S. Cl. ................................... 379/388; 379/44; 379/424; 379/211; 379/214; 324/660; 340/870.37; 340/562
[58] Field of Search ................. 379/388, 44, 424, 211, 379/214; 359/298; 324/61, 660; 340/562, 870.37

[56] References Cited

U.S. PATENT DOCUMENTS

| | | | |
|---|---|---|---|
| 3,250,172 | 5/1966 | Tirey | 359/298 |
| 4,650,931 | 3/1987 | Tsukada | 379/388 |
| 4,766,368 | 8/1988 | Cox . | |
| 4,893,071 | 1/1990 | Miller . | |

FOREIGN PATENT DOCUMENTS 2417149 10/1979 France ............................... 379/44

OTHER PUBLICATIONS

Horowitz, P. and Hill, W. "The Art of Electronics", 2nd ed. Cambridge University Press p. 889 (1989).

*Primary Examiner*—James L. Dwyer
*Assistant Examiner*—Jacques M. Saint-Surin
*Attorney, Agent, or Firm*—Geoffrey D. Green

[57] ABSTRACT

Capacitive proximity sensors are disclosed that can be fabricated in different shapes, sizes and materials used in a wide variety of applications. Each such sensor includes a sensing electrode and a guard electrode. The sensor electrode and guard electrode can be parallel conductors separated by an insulating layer, such as a double-sided circuit board shaped to suit the application. One such sensor is transparent for use in conjunction with an optical bar-code scanner. Another sensor is annular in shape for use in conjunction with a telephone transmitter. The sensing electrode and the guard electrode are driven in unison by an RF signal. The proximity of an object to the sensor is observed by detecting changes in the RF current flowing through the sensing electrode caused by the proximity of an object to the sensing electrode.

8 Claims, 4 Drawing Sheets

CAPACITIVE PROXIMITY SENSORS

FIELD OF THE INVENTION

This invention relates to capacitive proximity sensors, and more particularly to capacitive proximity sensor systems that can be adapted to suit different applications.

BACKGROUND OF THE INVENTION

Capacitive proximity sensors are widely used in various applications. For example, such sensors are used in place of pushbutton switches in keyboards and control panels, as limit switches in various kinds of equipment, to detect the flow of dry and liquid materials in pipes and to detect motion of objects relative to each other. Various other kinds of control systems are also well known in which capacitive proximity effects are used. For example, an embodiment of a capacitive proximity sensor as a part of a position control system is disclosed in FIG. 8 of U.S. Pat. No. 4,893,071 to Gabriel L. Miller.

Systems using capacitive proximity sensors typically measure the capacitance, or change in capacitance, of a sensing electrode with respect to its environment as an object being sensed moves in relation to the electrode. Typically, the sensing electrode is connected to an alternating current or radio frequency (RF) source and the current to the electrode is monitored to detect such capacitance changes.

In the design of such a system, care must be taken to shield not only the sensing electrode but also the wiring to such electrode from stray capacitances to ground or to other conductors. Depending on the application for the sensor, such shielding may be simple or complex. Typically, the sensing electrode is protected by a shielding or guard electrode that is shaped to protect the sensing electrode. One example is a sensing electrode and a guard electrode formed on different layers of a multi-layer circuit board as shown in U.S. Pat. No. 4,766,368 to Harold A. Cox.

Because of the wide variety of applications for capacitance proximity sensors, it is desirable to be able to form sensing electrodes in various shapes and sizes. Because of the need to shield such electrodes, it is also desirable to form the shield together with the electrode. Further, it is desirable to have electrical means that are simple and reliable for driving such shielded electrodes and that can be used with various shapes, sizes and types of electrodes.

SUMMARY OF THE INVENTION

The invention provides for capacitive proximity sensors that can be fabricated in different shapes and sizes and used in a wide variety of applications. Each such sensor includes a sensing electrode and a guard electrode spaced apart from each other by an insulating layer or other means. Such a sensor can be fabricated from a double-sided circuit board shaped to suit the application. One such sensor will be described in which the sensor electrode-insulator-guard electrode sandwich is transparent. Other sensors will be described that are shaped in the form of a frame or annulus or that are fabricated from conducting mesh. Such sensors can be small or arbitrarily large.

Regardless of the size, shape or material of the sensor, the sensing electrode and the guard electrode are driven in unison by an RF source. The capacitance between the sensing electrode and its surroundings changes as an object is brought near. This capacitance change is detected by measuring changes in the RF displacement current flowing from the sensing electrode. The guard electrode shields the sensing electrode from objects on its side of the sensor. Since both electrodes are driven in unison, no current flows between them. Changes in capacitance of the guard electrode have no effect.

A convenient way to measure changes in the current flowing from the sensing electrode is by means of a synchronous detector.

DETAILED DESCRIPTION OF THE INVENTION

Figure 1:
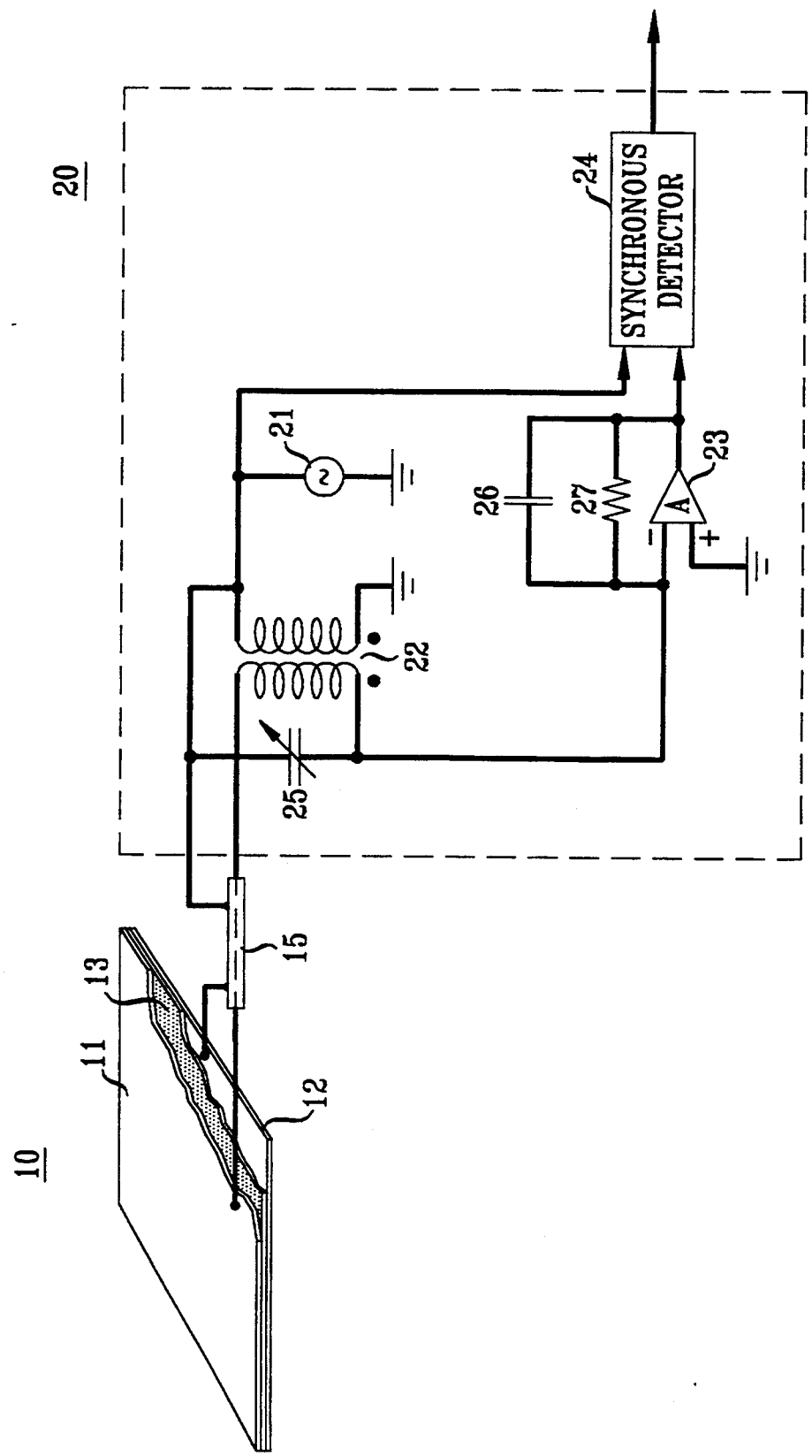
FIG. 1 shows a composite view of a capacitive proximity sensor driven by an RF signal applied through a bifilar transformer.

FIG. 1 is a composite diagram of a rectangular capacitive proximity sensor 10 and associated driving circuitry 20. Sensor 10 includes a conducting sensing electrode 11, a conducting guard electrode 12 and an insulator 13. The shape, size and materials of the sensor can be chosen to suit the application. For example, the sensor can be a simple square, rectangle, circle or a more complex shape and can be made to conform to a curved or irregular surface. The sensor can be fabricated in the form of an annulus or "picture frame" to surround an object. Materials for the sensor can be opaque or transparent. Various examples of sensors will be described below.

Sensor 10 is connected to circuit 20 by means of shielded cable 15, the shield and central conductor of cable 15 being connected to guard electrode 12 and sensing electrode 11 respectively at the sensor end. RF source 21 drives the shield of cable 15 directly and the central conductor of cable 15 through bifilar transformer 22, so that the sensing electrode and the guard electrode are driven in unison. One secondary terminal of transformer 22 is connected to such central conductor, the other end is connected to an input of operational amplifier 23 which, together with capacitor 26 and resistor 27, operates as an integrator. The outputs of amplifier 23 and source 21 are connected to inputs of synchronous detector 24, the output of which indicates the difference in phase and amplitude between the signals from amplifier 23 and source 21.

An advantage of the circuit formed by sensor 11, transformer 22 and capacitor 25 is that such circuit is actually a form of passive RF bridge, which is highly stable with time. Thus, once the circuit is adjusted by means of capacitor 25, it will be relatively stable and free from drift.

Synchronous detector 24 rectifies the output of amplifier 23 by switching alternately between inverted and uninverted versions of such output under the control of the signal from source 21. Synchronous detectors are well known in the art, for example, as shown on page 889 of "The Art of Electronics," Second Edition, by Paul Horowitz and Winfield Hill, Cambridge University Press (1989). Adjustable capacitor 25 serves to adjust the "zero" point of the sensor in a convenient way, and compensates the circuit for different sensor sizes and shielded cable lengths. A typical frequency of operation for RF source 21 is 100 KHz.

In operation, capacitor 25 is adjusted to minimize the output from synchronous detector 24 with no objects in the vicinity of sensor 10. When an object is moved close to sensor 10 (or when sensor 10 is moved close to an object), the resulting change in capacitance between sensing electrode 11 and its surroundings causes a change in the displacement current flowing from the sensing electrode, the in-phase component of the output signal from amplifier 23 increases and the output of detector 24 rises. The output of detector 24 can be used in analog form or connected to a comparator or threshold detector (not shown) to provide an output signal only when the signal from phase detector 24 reaches a certain level.

Figure 2:
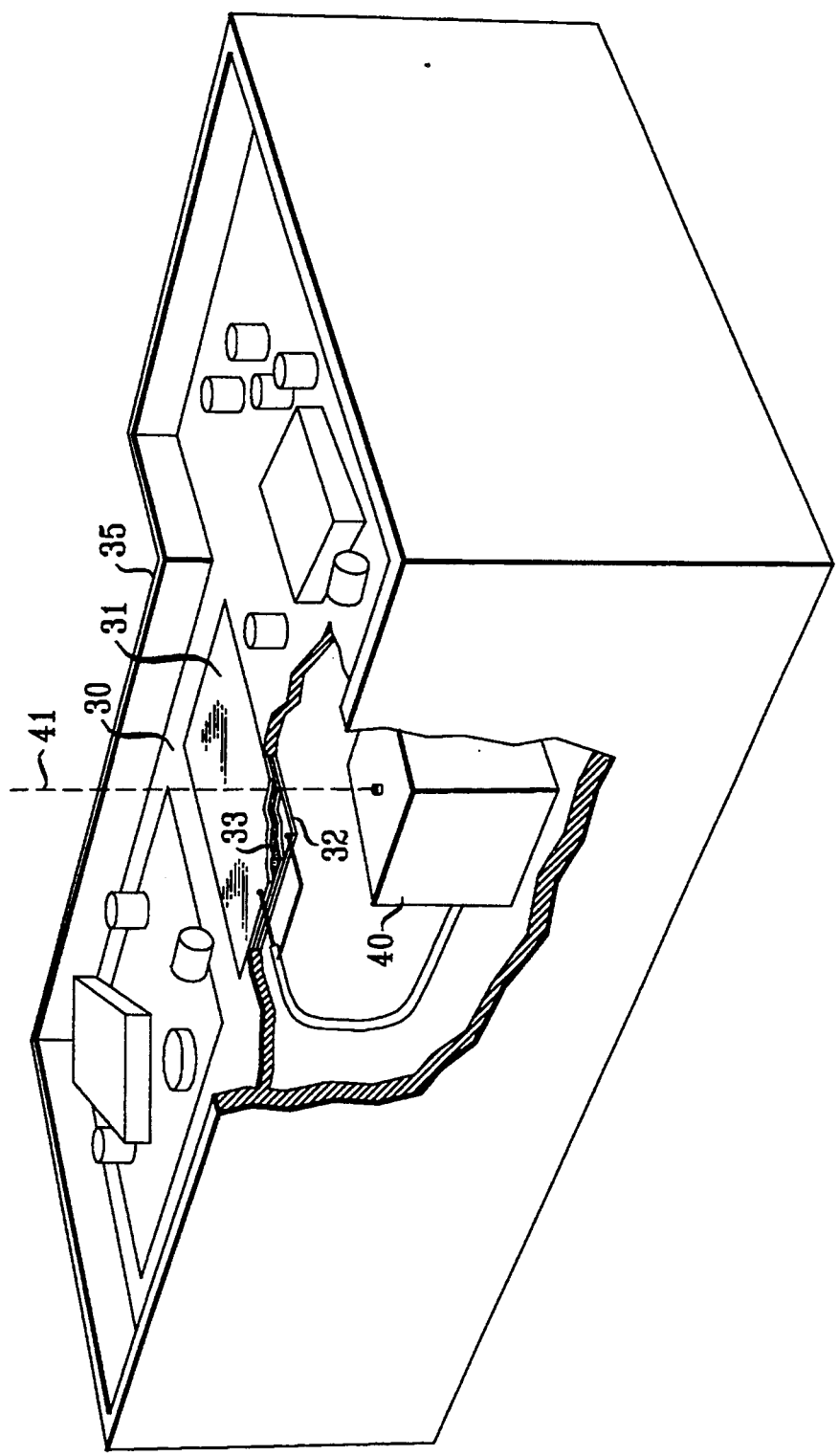
FIG. 2 shows a transparent capacitive proximity sensor in accordance with the present invention applied to an optical bar-code scanner for the purpose of turning on the scanner when an object is placed in position to be scanned.

FIG. 2 shows a capacitive proximity sensor 30 of the type described above incorporated in a supermarket checkout counter 35 to control the operation of an optical bar-code scanner 40. As is well known in the art, scanner 40 projects a moving light beam 41. Scanner 40 detects light reflected from an object placed in the path of light beam 41 and recognizes and decodes variations in the reflected light caused by a bar code on the object. Light beam 41 is typically generated by a laser source and it is desirable not to keep such laser source operating when no object to be scanned is present. Accordingly, sensor 30 can be used to turn on the scanner when an object is near the sensor and turn off the scanner when an object is not present. Obviously sensor 30 must be transparent to allow light beam 41 and its reflections to pass. As shown in the partially cutaway view of sensor 30 in FIG. 2, sensor 30 can be a sandwich comprising a transparent sensing electrode 31 and a transparent guard electrode 32 with transparent insulator 33 between. Such electrodes can be a material such as glass or plastic with a fine wire mesh or screen embedded therein, or a transparent material treated or doped with an additive to render it conductive. Sensor 30 is connected by shielded cable 36 to a control circuit (not shown) similar to circuit 20 in FIG. 1 to turn light beam 41 on and off as described.

Figure 3:
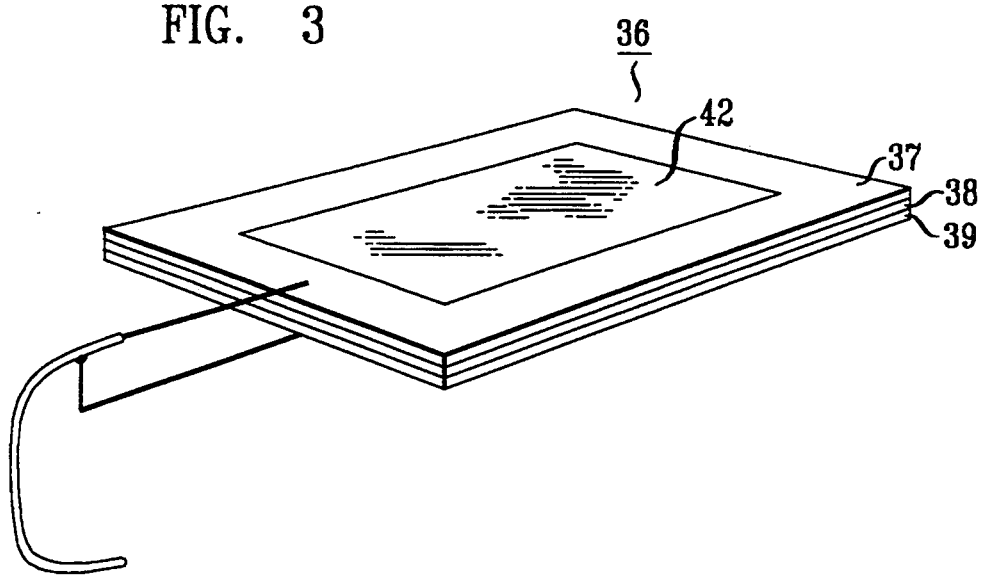
FIG. 3 shows an alternative sensor for the bar-code scanner shown in FIG. 2.

An alternative structure for sensor 30 is shown in FIG. 3. Sensor 36 is fabricated as an opaque frame surrounding transparent window 42. Sensor 36 again has three layers: sensing electrode 37, insulating layer 38 and guard electrode 39. Again, sensing electrode 37 and guard electrode 39 are connected to the control circuit (not shown).

Figure 4:
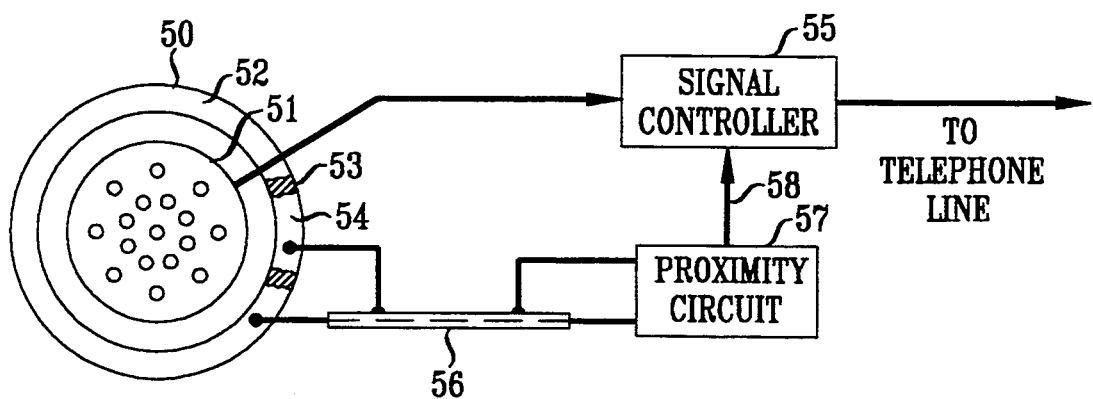
FIG. 4 shows an annular capacitive proximity sensor in accordance with the present invention for use with a telephone handset to sense the distance between the transmitter and the user's mouth.

FIG. 4 shows a capacitive proximity sensor 50 in the form of an annular ring for controlling a signal from a telephone transmitter 51. Again, sensor 50 is a three-layer sandwich of two conductors with an insulator between, and is shown partially cut away in FIG. 4 to reveal sensing electrode 52, insulating layer 53 and guard electrode 54. Sensor 50 can be mounted in the telephone handset so as to surround transmitter 51 and not interfere with the acoustic signal traveling from the speaker's mouth to the transmitter, and with sensing electrode 52 mounted nearest the speaker's face. Transmitter 51 is connected through signal controller 55 to the telephone line. Sensor 50 is connected by shielded cable 56 to proximity circuit 57, which is similar to circuit 20 in FIG. 1. Proximity circuit 57 is connected to controller 55 via lead 58 to control the telephone signal in accordance with the distance between sensor 50 and the speaker's face. That is, the speaker's face is the object being detected by sensor 50.

A capacitive proximity sensor 50 of the type shown in FIG. 3 has been constructed and found to operate satisfactorily in a standard telephone handset. The presence of the speaker's hand holding the handset does not affect the sensor because of the shielding effect of the guard electrode. The sensor will respond, when a hand is placed over the transmitter or when the telephone handset is placed transmitter-side down on a conducting surface. However, if the handset is placed on a surface, transmitter-side up, the sensor does not respond.

One possible application for sensor 50 as shown in FIG. 4 is to simply control the amplitude of the speech signal in accordance with the distance sensed. Another application is in systems where the distance between the speaker's mouth and the transmitter must be constantly monitored, such as systems for reducing or eliminating background noise in telephone conversations. Some systems use the characteristics of the speech signal itself as the controlling signal. An advantage of using a capacitive proximity sensor for such applications is that the proximity measurement is completely independent of the speech signal itself and can be made regardless of whether speech is present.

Figure 5:
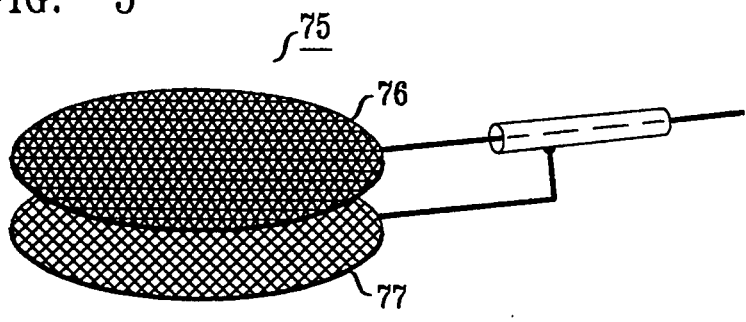
FIG. 5 shows an alternative capacitive proximity sensor using mesh electrodes for the application shown in FIG. 4.

An alternative capacitive proximity sensor in accordance with the invention for use in conjunction with a telephone transmitter is shown in FIG. 5. In sensor 75, sensing electrode 76 and guard electrode 77 are made of a conducting mesh. An insulator (not shown), such as an open-cell foam, can be placed between the electrodes, or the electrodes can be spaced apart in an insulating frame. The action of sensor 75 is similar to the other sensors described above.

Note that the analog capability of the capacitive proximity sensor of the invention can be made use of in this application. That is, the control signal on lead 58 can be an analog signal representing the distance from sensor 50 to the speaker's face and the telephone signal from transmitter 51 can be controlled in an analog manner, if desired. However, such analog signal will be a nonlinear representation of such distance in that the change in the analog signal will take place within the last few inches as the transmitter is moved toward the speaker's face.

Figure 6:
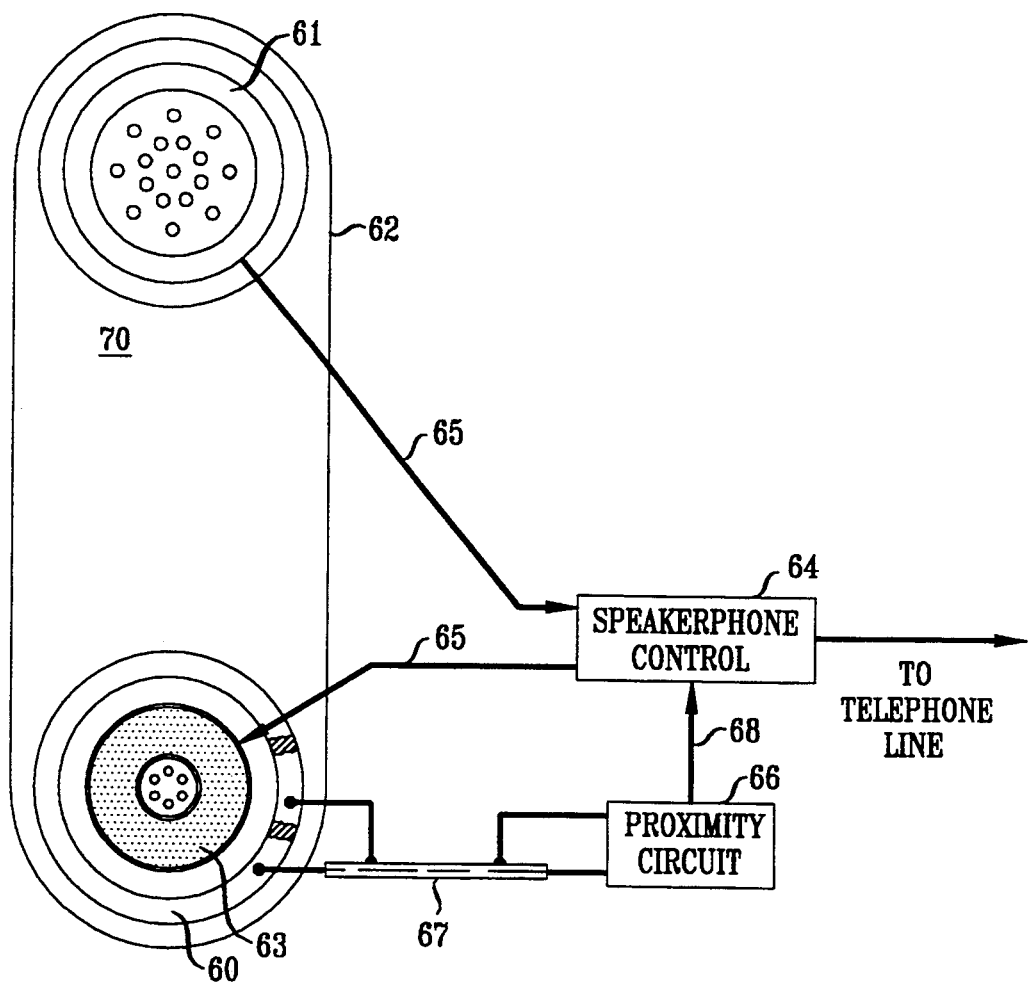
FIG. 6 shows a similar sensor to that in FIG. 4 but arranged to control the operating mode of a telephone handset as either a conventional handset or a speakerphone depending on the distance between the receiver and the user's ear.

FIG. 6 shows the annular capacitive proximity sensor of FIG. 3 used in combination with a microphone and a loudspeaker in a housing to form a unit 70 that can be used either as a telephone handset in the usual way or as a speakerphone. In unit 70, annular capacitive proximity sensor 60 and loudspeaker 63 are mounted in housing 62 together with microphone 61. Sensor 60 is used in this application to measure the distance from loudspeaker 63 to the user's ear. Microphone 61 and loudspeaker 63 are connected to speakerphone control 64 by leads 65. Sensor 60 is connected to proximity circuit 66 by shielded cable 67. Proximity circuit 66 controls speakerphone control 64 via lead 68.

Microphone 61 and loudspeaker 63 serve a dual function: as transmitter and receiver when unit 70 is used as a telephone handset and as microphone and loudspeaker when unit 70 is used as a speakerphone. Speakerphone control 64 operates in telephone mode or speakerphone mode as directed by the signal on lead 68. In telephone mode, speakerphone control 64 reduces the gain of the circuits leading to loudspeaker 63 and from microphone 61 so that such components function as a telephone transmitter and a telephone receiver in the usual way. In speakerphone mode, speakerphone control 64 increases the gain of such circuits so that such components function as a speakerphone. Speakerphone control 64 is similar to devices well known in the art, except that it functions by controlling gain in circuits leading to dual-function components instead of by switching between separate transmitter-receiver and microphone-loudspeaker units. Of course, speakerphone control 64 can also include a manual volume control for loudspeaker 63 and other speakerphone controls well known in the art.

In operation, when unit 70 is some distance from the user's head, the signal on lead 68 is at a low level, and speakerphone control 64 operates unit 70 in speakerphone mode. When unit 70 is moved so that microphone 61 and sensor 60 are close to the user's head, the signal on lead 68 is at a high level and speakerphone control 64 switches to telephone mode.

The above description describes only a few applications of the capacitive proximity sensors in accordance with the invention, but such applications demonstrate the adaptability of the invention and the possibility of its use for widely different purposes. It will be clear from the examples described above that capacitance proximity sensors in accordance with the invention can be of any practical size, from small, as in the case of a "push-button" or the telephone-related applications, to large, as in the case of the bar-code scanner application. Such sensors can be made arbitrarily large if necessary for the application being served.

It is understood that other embodiments are possible that incorporate the principles of the invention and that the above disclosure is merely illustrative of such principles and is not intended to be limiting in any respect.

What is claimed is:

1. A capacitive controller the operation of a telephone handset in accordance with the distance from a portion of such handset to the head of a user, said handset including a transmitter and receiver, which comprises:
   a sensing electrode,
   an insulating layer,
   a guard electrode spaced away from said sensing by electrode by said insulating layer and shaped to shield said sensing electrode, said sensing electrode, said insulating layer and said guard electrode being incorporated in said handset,
   means for applying RF signals in unison to said sensing electrode and said guard electrode,
   means for generating a control signal from changes in the current flowing through said sensing electrode resulting from proximity of handset to the user's head, and
   means responsive to said control signal for controlling the operation of said handset.

2. The controller of claim 1 adapted for controlling signals from the transmitter of handset and in which said sensing electrode, said guard electrode and said insulating layer are annular in shape and positioned to surround said telephone transmitter.

3. The controller of claim 1 adapted for controlling signals from the transmitter of handset and in which said sensing electrode and said guard electrode are fabricated from a conducting mesh shaped to cover said transmitter.

4. The controller of claim 1 adapted for controlling the operation of said telephone handset as either a conventional handset or a speakerphone in accordance with the distance from said receiver to the ear of a user
   wherein said sensing electrode, said guard electrode and said intervening insulating layer are annular in shape and positioned to surround said receiver and
   wherein said
   means responsive to said control signal further comprises:
   means for causing said handset to operate as a conventional telephone handset when said receiver is closed to the user's ear and as a speakerphone when said microphone is spaced away from the user's ear.

5. A capacitive controller for detecting when an object to be scanned is within the range of an optical scanner, said optical scanner having a light source, which comprises:
   a sensing electrode,
   an insulating layer,
   a guard electrode spaced away from said sensing electrode by said insulating layer and shaped to shield said sensing electrode,
   means for applying RF signals in unison to said sensing electrode and said guard electrode
   means for generating a control signal from changes in the current flowing through said sensing electrode resulting from proximity of an object to said sensing electrode and
   means responsive to said control signal for energizing said light source when said object is within range of said scanner.

6. The controller of claim 5 wherein said optical scanner includes a window through which a light beam from said light source and a reflected light beam from said object pass and wherein said sensing electrode, said insulating layer and said guard electrode are transparent to said light beams and form said window.

7. The controller of claim 5 wherein said optical scanner includes a window through which a light beam from said light source and a reflected light beam from said object pass and wherein said sensing electrode, said insulating layer and said guard electrode are positioned on the periphery of said window.

8. The controller of claim 1 or 5 in which said means for applying RF signals in unison is a passive RF bridge and said means for detecting changes comprises an integrator with an input connected to said RF bridge and a synchronous detector with a first input connected to said means for applying RF signals and a second input connected to the output of said integrator and wherein said control signal is the output of said synchronous detector.

* * * * *